(12) United States Patent
Lim

(10) Patent No.: US 7,439,143 B2
(45) Date of Patent: Oct. 21, 2008

(54) FLASH MEMORY DEVICE AND METHOD OF MANUFACTURING THE SAME

(75) Inventor: Hyun Ju Lim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 64 days.

(21) Appl. No.: 11/638,077

(22) Filed: Dec. 12, 2006

(65) Prior Publication Data

US 2007/0131973 A1    Jun. 14, 2007

(30) Foreign Application Priority Data

Dec. 13, 2005   (KR) ............... 10-2005-0122506

(51) Int. Cl.
*H01L 21/336* (2006.01)
(52) U.S. Cl. .............. 438/301; 438/299; 438/694; 438/695; 438/696; 438/700; 438/701
(58) Field of Classification Search ........... 438/299, 438/301, 694–696, 700–701
See application file for complete search history.

(56) References Cited

U.S. PATENT DOCUMENTS

| | | | |
|---|---|---|---|
| 6,812,120 B1 * | 11/2004 | Young et al. | 438/589 |
| 7,195,977 B2 * | 3/2007 | Jung et al. | 438/262 |
| 7,235,478 B2 * | 6/2007 | Geng et al. | 438/634 |
| 2002/0039843 A1 * | 4/2002 | Ikeda et al. | 438/738 |
| 2002/0132427 A1 * | 9/2002 | Rudeck et al. | 438/257 |
| 2004/0248413 A1 * | 12/2004 | Donohoe et al. | 438/689 |
| 2005/0106888 A1 * | 5/2005 | Chiu et al. | 438/710 |

* cited by examiner

*Primary Examiner*—Zandra Smith
*Assistant Examiner*—Bac H Au
(74) *Attorney, Agent, or Firm*—Andrew D. Fortney

(57) ABSTRACT

Disclosed is a flash memory device. The flash memory device includes a plurality of trench lines in an isolation region of a semiconductor device, a common source region along a word line (WL) direction under a surface portion of the semiconductor substrate, a plurality of gate lines along a vertical direction of the trench line, a drain region on an opposite side of the gate line to the common source region, a drain contact over the drain region, and a uniform by-product layer on the common source region.

12 Claims, 6 Drawing Sheets

FLASH MEMORY DEVICE AND METHOD OF MANUFACTURING THE SAME

BACKGROUND OF THE INVENTION

1. Field of the Invention

The present invention relates to a flash memory device and a method of manufacturing the same.

2. Description of the Related Art

In general, a flash memory device includes the advantages of EPROM having programming and erasing characteristics and EEPROM having electrically programming and erasing characteristics. This kind of flash memory device generally includes a thin tunnel oxide layer formed on a silicon substrate, a floating gate integrated on the oxide layer, an insulating layer, a control gate, and source and drain regions formed on the exposed portion of the substrate, in order to accomplish 1-bit storage using one transistor and to implement electrical programming and erasing.

Such a flash memory device may include a source connecting layer for connecting the source of each unit cell to form a source line. The source connecting layer can be formed by using a metal contact method by which a contact is formed in the source of each unit cell. However, this method is not appropriate for the manufacture of a highly integrated device because a contact margin should be considered. Therefore, recently, a common source line formed as an impurity diffusion layer through a self aligned source (SAS) process has been used to realize a highly integrated device.

In detail, the SAS process includes to an anisotropic etching process, in which a source region of a cell is opened by using a separate SAS mask after forming a gate electrode having a stacked structure, and then removing a field oxide layer to form a common source line relative to a neighboring cell.

Such an SAS technique may shrink the size of a cell in the bit line (BL) direction, and so the gate to source space can be reduced. Therefore, this technique is a useful process for accomplishing a device having a line width of 0.25 μm level.

Impurity ions such as arsenic (As) are implanted with high energy so as to form a junction having a predetermined depth on the common source line formed through the SAS process.

However, since the common source line is formed along the profile of a trench in a memory cell formed through the SAS process, the contact resistance of the source per cell is rapidly increased, in practice. This is because the length of the real surface resistance is increased due to the junction resistance formed along the surface profile of the trench region, so the specific resistance of the sidewall of the trench region is increased. That is, a relatively small amount of ions are implanted into the sidewall portion of the trench region during the ion implantation process, so the resistance may increase significantly.

In particular, most memory cells having a line width of at least or about 0.25 μm or 0.18 μm employ a shallow trench isolation (STI) process as an isolation technique. The STI process can be a useful process to shrink the size of the cell along a word line (WL) direction, while the SAS process is essential to shrink the cell size along a bit line (BL) direction, depending on the orientation of the word lines and bit lines. However, if these processes are simultaneously applied, the source resistance can be remarkably increased.

Since flash memory devices generally utilize an internal high voltage for programming and/or erasing operations, when the cell size is decreased, the depth of the trench should be increased, resulting in an increase in the length of the common source line, in turn adversely affecting the source resistance. In the case of an embedded flash memory device, potentially fatal product defects including degradation of programming characteristics and reading speed may result.

Meanwhile, since the impurity ions are implanted with high energy, the surface of the common source line can be damaged, further increasing a surface resistance, thereby deteriorating the characteristics of a resulting semiconductor device.

SUMMARY OF THE INVENTION

Accordingly, an object of the present invention is to provide a flash memory device and a method of manufacturing the same, capable of reducing or minimizing contact resistance of a common source line generated during an SAS process.

To accomplish the above-described object, the present invention provides a flash memory device comprising a plurality of trench lines in an isolation region of a semiconductor substrate, a common source region (formed by implanting impurity ions) along a word line (WL) direction under a surface portion of the semiconductor substrate, a plurality of gate lines in a vertical direction of the trench line, a drain region in a region of the substrate adjacent to the gate line and opposite to the common source region, a drain contact over the drain region, and a uniform by-product layer on the common source region.

The present invention also provides a method of manufacturing a flash memory device including a common source region, the method comprising the steps of forming a gate line on a semiconductor substrate having an isolation layer, forming a self aligned mask on the semiconductor substrate and the gate line other than on the common source region, removing the isolation layer in the common source region using the self aligned mask and the gate line as a mask and uniformly depositing a by-product (generally produced during the removal of the isolation layer) onto the (exposed) common source region, and implanting impurity ions into the exposed common source region.

DETAILED DESCRIPTION OF THE INVENTION

Hereinafter, the flash memory device and the method of manufacturing the same according to preferred embodiments of the present invention will be described in detail with reference to the attached drawings.

It will also be understood that when a layer is referred to as being "on" another layer or substrate, it can be directly on the other layer or substrate, or intervening layers may also be present.

Figure 1:
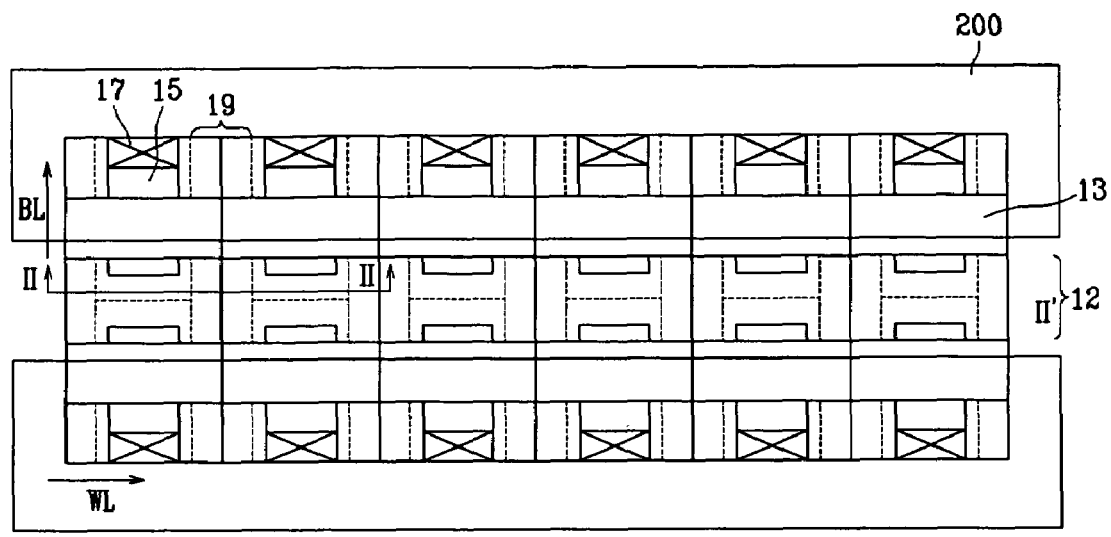
FIG. 1 is a layout view showing a flash memory device according to a preferred embodiment of the present invention.
Figure 2:
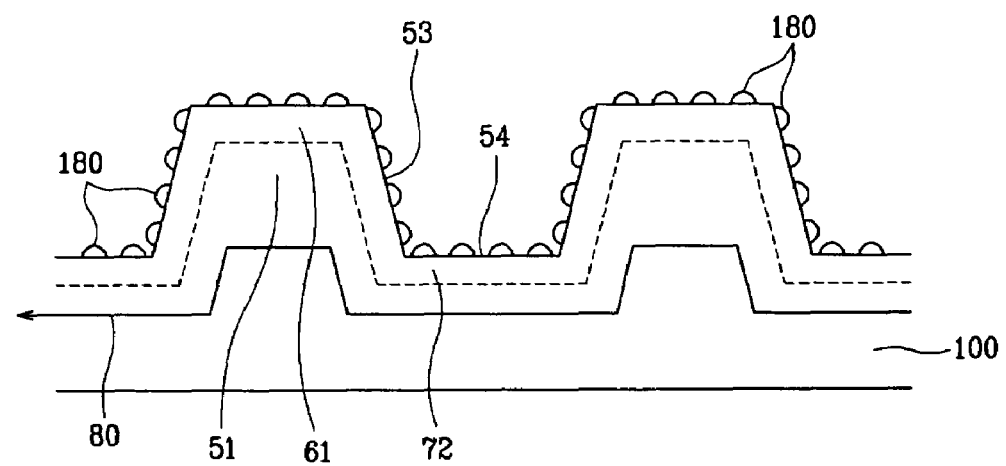
FIG. 2 is a cross-sectional view taken along line II-II' of the flash memory device illustrated in FIG. 1.

FIG. 1 is a layout view showing a flash memory device according to a preferred embodiment of the present invention, and FIG. 2 is a cross-sectional view taken along line II-II' shown in FIG. 1.

Referring to FIGS. 1 and 2, a flash memory device according to a preferred embodiment of the present invention includes a plurality of trench lines 19 formed on a semiconductor substrate 100 corresponding to an isolation region. The trench lines 19 are formed in parallel with a bit line BL. Here, in FIG. 1, the vertical dotted lines represent the border of the sidewall of the trench line 19. As shown in FIG. 2, the sidewall of the trench may be slanted, or have a characteristic angle (e.g., of from 75° to 88° with respect to a horizontal plane of the substrate).

A common source region 12 is formed at and/or below the surface of the semiconductor substrate 100 by implanting dopants in the substrate. In a preferred embodiment, the long axis of the common source region 12 is generally in the direction of a word line WL.

Perpendicular to the direction of the trench line 19, that is, parallel to the direction of the word line WL, a plurality of gate lines 13 are formed. A drain region 15 is formed in a region of the substrate adjacent to the gate line 13, but opposite to the common source region 12. A drain contact 17 is formed in a portion of the drain region 15, over the drain region 15.

As illustrated in FIG. 1, an SAS mask 200 exposes a gap between a first gate line 13 and a neighboring gate line 13, and a border or edge of the SAS mask 200 is arranged on the gate line 13 in parallel with the gate line 13.

As illustrated in FIGS. 1 and 2, at the common source region 12 (FIG. 1) formed by using the SAS mask 200, ions 72 (FIG. 2) implanted into the surface portion of the trench region 53 are present, and at the source region 51, ions 61 implanted into the surface portion of the source region 51 are present.

On the common source region 12, etching by-products 180 may remain. In one embodiment, etching by-products 180 are uniformly located or distributed. Alternatively, etching by-products 180 form a uniform layer on the common source region 12. The by-product 180 reduces or prevents the loss of a portion of the surface of the semiconductor substrate 100 during ion implantation onto the common source region 12 and reduces or prevents an increase in the surface resistance of the common source region 12.

Accordingly, a common source line 80 of the common source region 12 may be formed with a constant depth along the surface of the trench region 53 and the surface of the source region 51, and so the resistance of the common source line 80 is reduced.

Hereinafter, the method of manufacturing the flash memory device according to the preferred embodiment of the present invention will be described in detail with reference to attached drawings.

FIGS. 3 to 6 are cross-sectional views illustrating the procedure for manufacturing a flash memory device according to an embodiment of the present invention.

Figure 3:
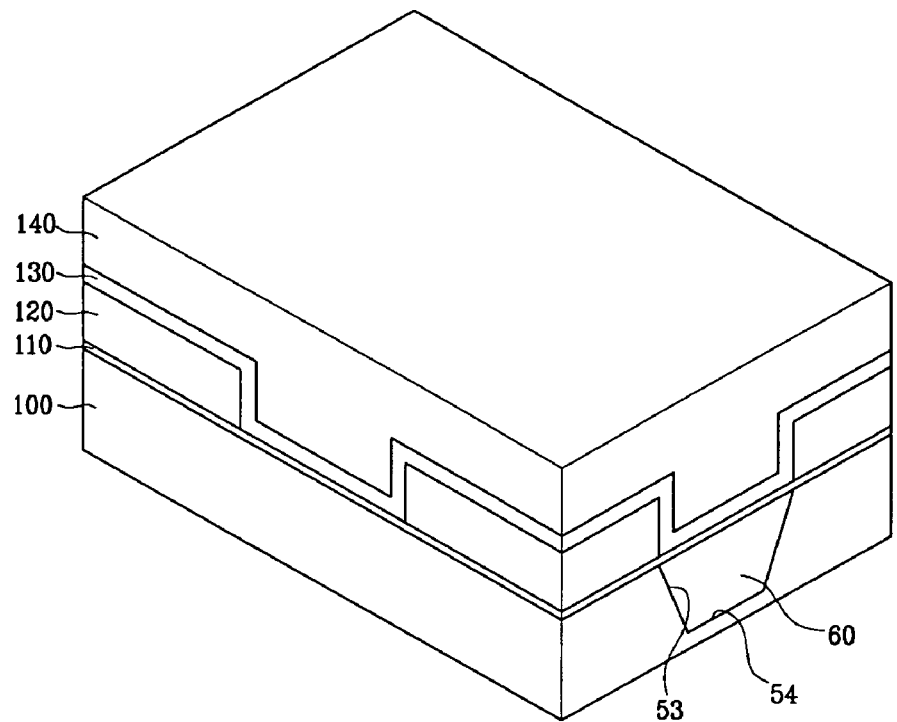
FIGS. 3 to 6 are cross-sectional views for explaining a method of manufacturing a flash memory device according to a preferred embodiment of the present invention.

According to an exemplary method of manufacturing a flash memory cell of the present invention, as shown in FIG. 3, trench regions 53 and 54 are formed on a semiconductor substrate 100 and an isolation layer 60 is formed by filling the trench regions 53 and 54 with insulating material. For example, the trench may be formed and filled by a conventional shallow trench isolation (STI) method.

The trench regions 53 and 54 correspond to the trench lines 19 shown in FIG. 1. The plurality of the trench lines 19 are formed in parallel with a bit line BL. In addition, a first oxide layer 110 is formed on the semiconductor substrate 100 except for the trench line 19. The first oxide layer 110 may thus comprise silicon dioxide, and be grown by conventional wet or dry thermal oxidation of exposed silicon. A first polysilicon layer 120 is deposited on the semiconductor substrate 100 and the first oxide layer 110.

Then, the first polysilicon layer 120 covering the common source region 12 is removed to expose the first oxide layer 110 (if the first oxide layer 110 is deposited, for example by chemical vapor deposition [CVD] and optional densification) or the isolation layer 60 in the trench if the first oxide layer 110 is grown by thermal oxidation).

After that, a second oxide layer 130 and a second polysilicon layer 140 are subsequently formed on the first polysilicon layer 120 and the first oxide layer 110.

Figure 4:
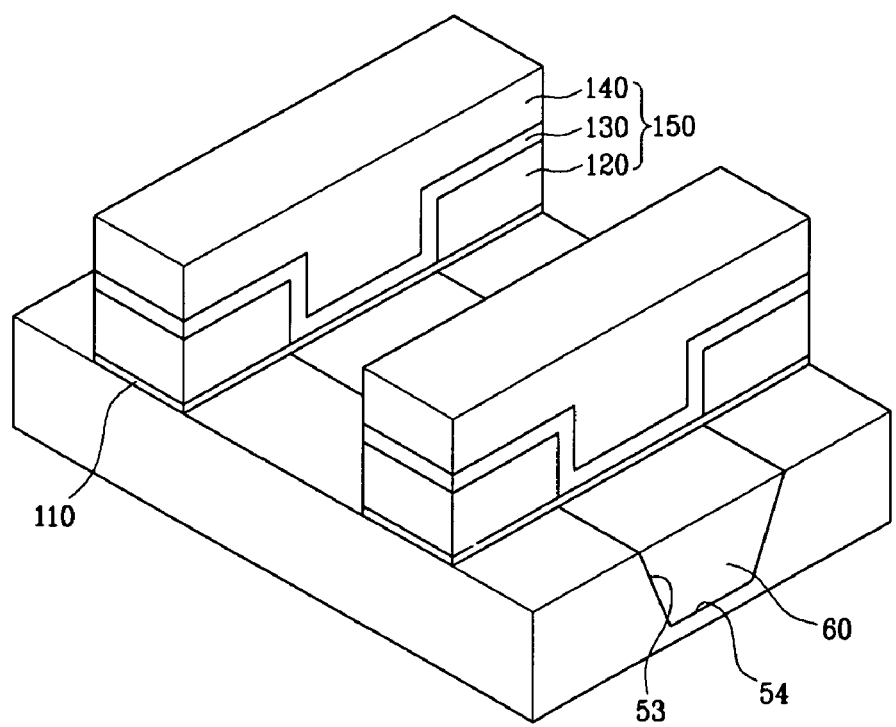

Then, referring to FIG. 4, the second polysilicon layer 140, the second oxide layer 130 and the first polysilicon layer 120 are subsequently patterned and etched by photolithography and dry/plasma etching to expose a portion of the isolation layer 60 and the semiconductor substrate 100.

Through the above-described processes, a plurality of gate lines 13 are formed in a direction perpendicular to the trench lines 19 and in parallel to the word line WL.

Figure 5:
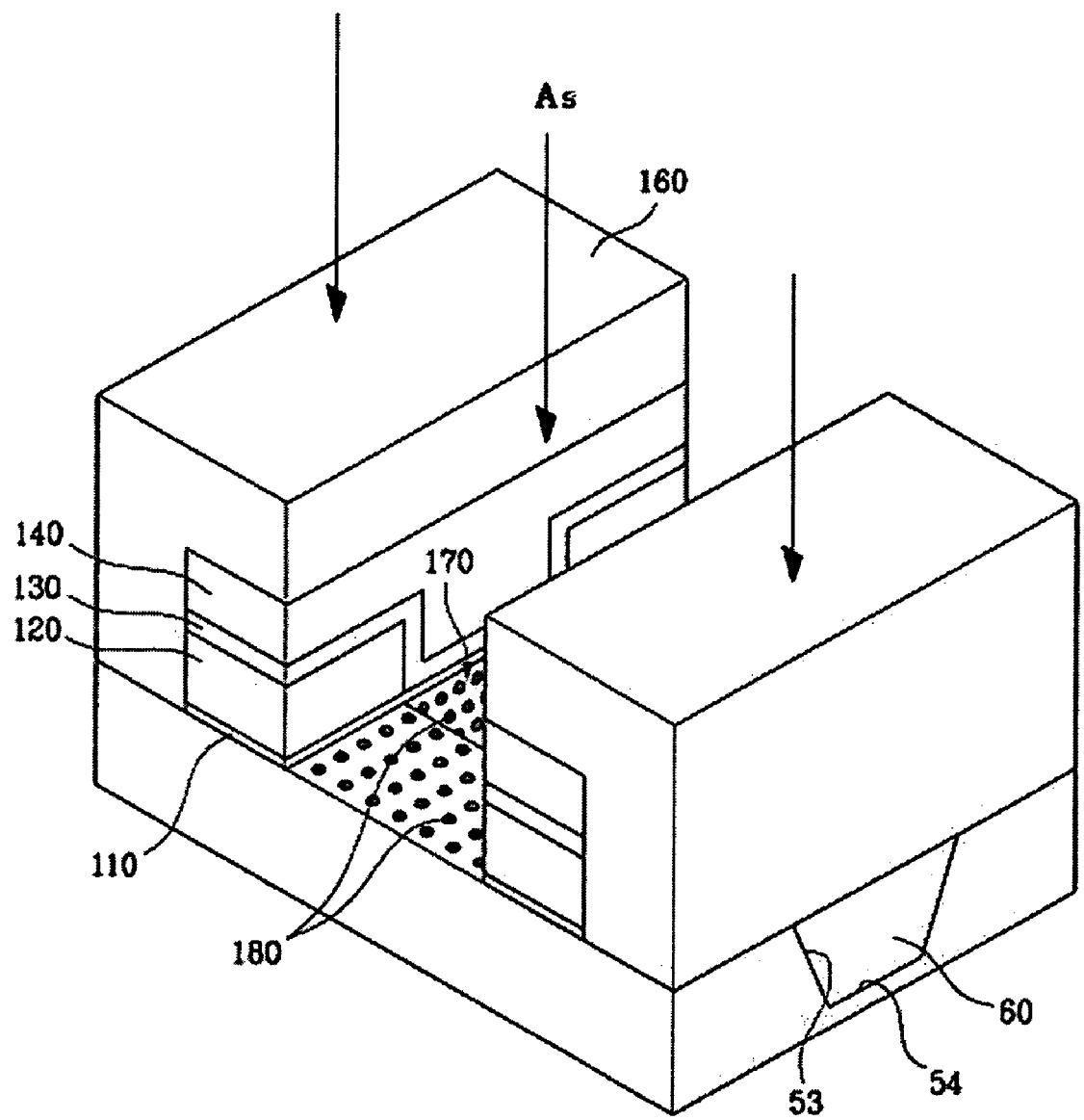

Then, referring to FIG. 5, a self aligned mask 160 is formed on the entire surface of the semiconductor substrate 100 except for the common source region 12 by using photoresist, and the isolation layer 60 remaining and/or exposed in the common source region 12 is removed to expose the semiconductor substrate 100 using the mask 160 and the gate line 13 as a self aligned mask to form a common source line 80.

By implementing the above-described processes, a $C_xF_y$-based or $C_xF_yH_z$-based by-product (which may comprise a fluorocarbon- and/or hydrofluoro-carbon-based polymer) is generated and a portion of the exposed semiconductor substrate 170 may be removed, or the sidewall of the second polysilicon layer 140, the second oxide layer 130, the first polysilicon layer 120 and the first oxide layer 110 may be damaged, thereby increasing a risk that the characteristics and reliability of the semiconductor device may deteriorate.

In order to solve this problem, according to the present invention, a plasma etching process is performed to remove the isolation layer 60.

For example, a plasma apparatus such as DRM (dipole ring magnetron) available from Tokyo Electron (TEL) Co., which generates a plasma in a MERIE (magnetic enhanced reactive ion etching) scheme, can be used.

In particular, the $C_xF_y$-based by-product generated during the etching process is deposited on the surface of the semiconductor substrate exposed after removing the isolation layer 60 in this embodiment of the present invention.

In addition, the loss of the semiconductor substrate exposed after etching the isolation layer 60 during the removing process for the isolation layer 60 is minimized, and the generated by-product is uniformly formed or attached on the surface of the semiconductor substrate according to this embodiment of the present invention.

At this time, the amount or the thickness of the by-product can be determined considering the time period of the etching process.

For example, the isolation layer can be removed by processing in the plasma apparatus for about 30 to 90 seconds, under typical processing conditions for removing such STI oxides. When the processing time is less than 30 seconds, the amount of the by-product is too small and the isolation layer cannot be completely removed. When the processing time exceeds 90 seconds, the isolation layer may be overetched, and the depth of the trench in the semiconductor substrate may become too deep.

In the present invention, the isolation layer can be removed by a plasma formed from $C_5F_8$ gas and $CH_2F_2$ gas, along with an inert gas to produce $C_xF_y$-based or $C_xF_yH_z$-based by-product. Alternatively, the $C_5F_8$ gas may be replaced with one or more gas-phase fluorocarbon etching agents (e.g., $CF_4$, $C_2F_6$, $C_3F_8$, $C_3F_6$, cyclo-$C_4F_8$, $C_4F_{10}$, cyclo-$C_5F_{10}$, etc.), and the $CH_2F_2$ gas may be replaced with one or more gas-phase hydrofluorocarbon etching agents (e.g., $CHF_3$, $C_2F_5H$, 1,1,1,2- or 1,1,2,2-tetra-fluoroethane [$C_2F_4H_2$], $C_3F_6H_2$, etc.).

For example, the isolation layer can be removed by etching the isolation layer 60 in a plasma generated by flowing $C_5F_8$ (or other fluorocarbon) gas at a rate of about 5 sccm to 20 sccm, $CH_2F_2$ (or other hydrofluorocarbon) gas at a rate of about 1 sccm to 20 sccm, and Ar (or other noble) gas at a rate of about 300 sccm to 500 sccm, while keeping an electric power of about 1,500 W to 2,000 W and a pressure of about 10 mT to 50 mT, thereby minimizing the loss of the semiconductor substrate after the etching process. Thus, the polymeric by-product can be uniformly distributed or attached to the surface of the semiconductor substrate.

Figure 7:
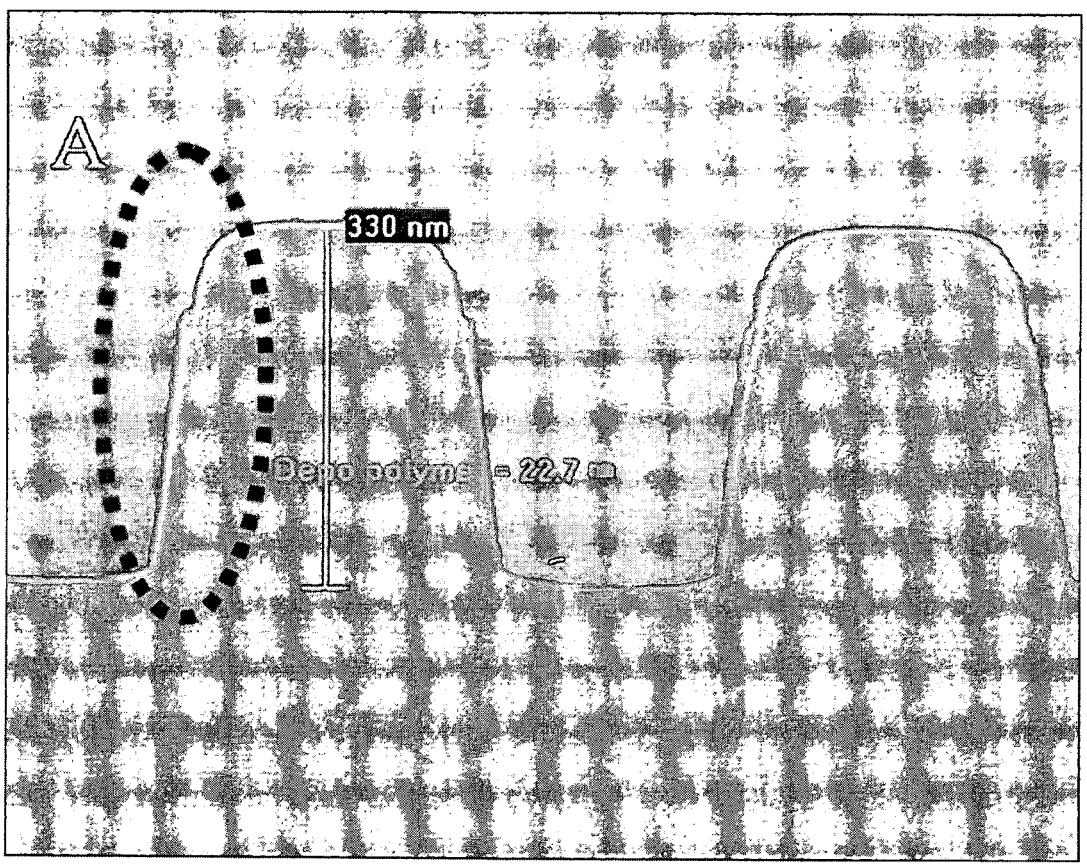
FIG. 7 is a cross-sectional view showing a conventional flash memory device.
Figure 8:
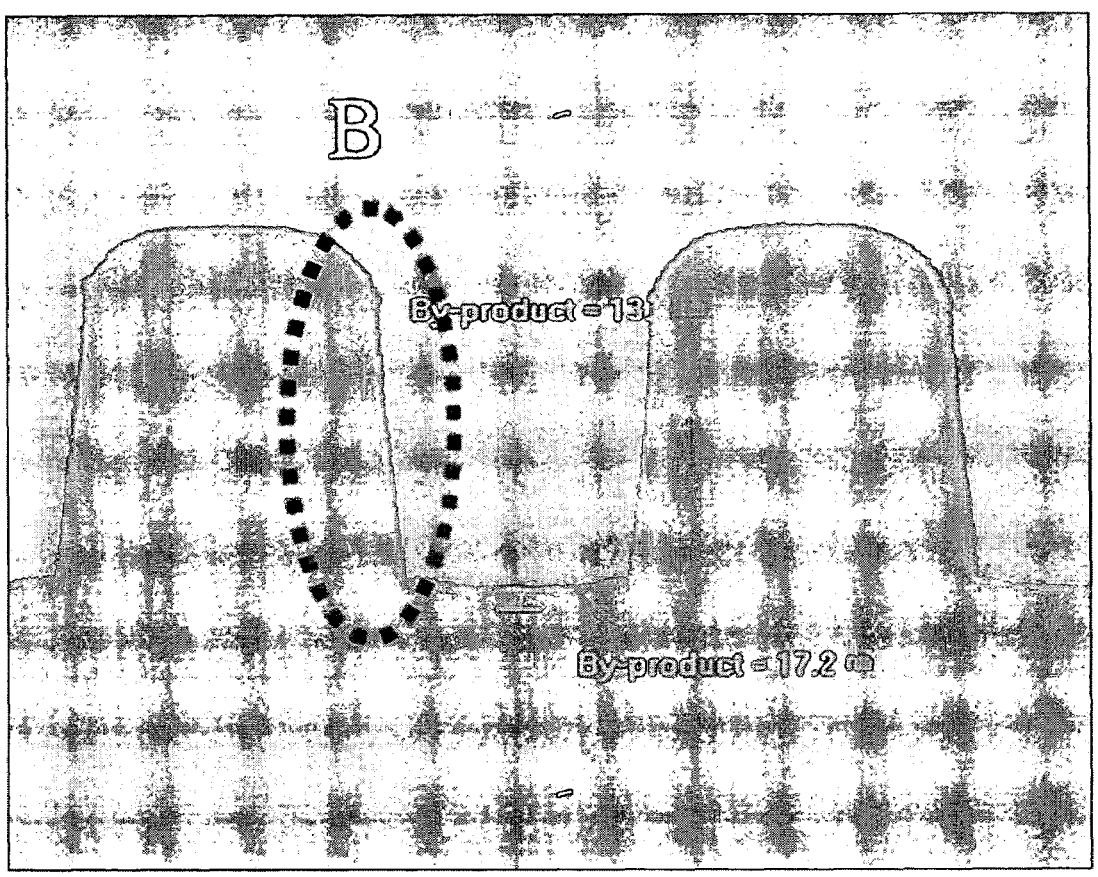
FIG. 8 is a cross-sectional view showing a flash memory device according to a preferred embodiment of the present invention.

FIG. 7 is a cross-sectional view of a conventional flash memory device and FIG. 8 is a cross-sectional view of an exemplary flash memory device according to a preferred embodiment of the present invention.

Referring to FIG. 7, the depth of the trench is about 330 nm and the thickness of the by-product A, which is a deposited polymer created during the etching process of the isolation layer, is 17.2 nm. The by-product is irregularly formed on the sidewall portion and on the bottom portion of the isolation layer.

In addition, the profile of the trench may become dull according to the conventional method.

However, referring to FIG. 8, it is confirmed that the by-product B is uniformly deposited on the side slope portion and the top and the bottom portion of the semiconductor substrate from which the isolation layer is removed in the flash memory device and method according to a preferred embodiment of the present invention, when compared with the conventional method, as shown in the cross-sectional SEM images of FIGS. 7-8. Therefore, the formation of a non-uniform impurity diffusion layer during subsequent ion implantation can be reduced or prevented, and the damage to the semiconductor substrate due to injected ions during the ion impurity implantation also can be reduced or prevented.

According to the present invention, the profile of the trench also can be kept in a substantially vertical shape (e.g., along the plane of the gate and word line sidewall).

After that, high-density impurity ions 61 and 72 such as As (or, alternatively, P or B) are implanted onto the semiconductor substrate 100 to form a common source region 12.

Figure 6:
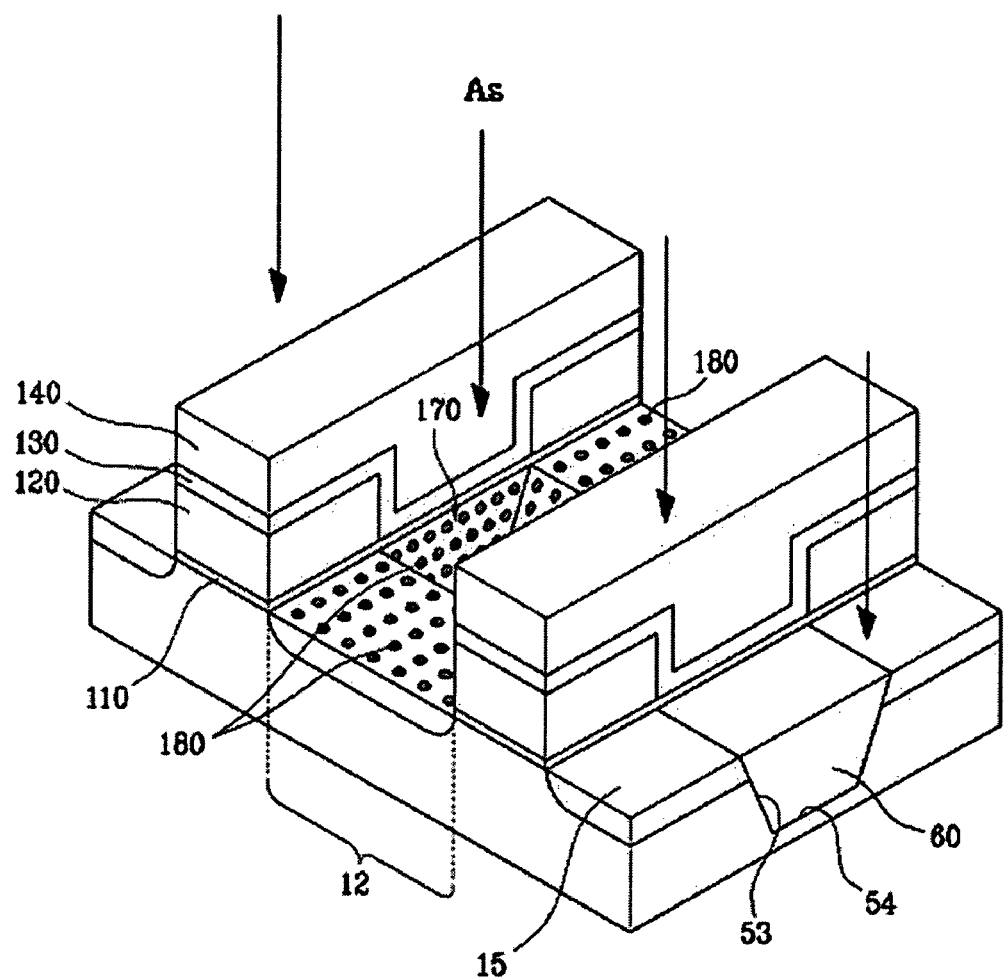

Then, referring to FIG. 6, the mask 160 is removed and high-density impurity ions 61 and 72 such as As (or, alternatively, P or B, depending on the ion implanted into the common source region 12) are implanted to form a drain region 15.

At this time, as described above, the by-product 180 remains on the exposed semiconductor substrate 100, that is on the common source region 12 as illustrated in FIG. 2. As a result, the loss of a (surface) portion of the semiconductor substrate 100 due to the impurity ions injected at a high energy can be reduced, minimized or prevented, and an increase of the surface resistance of the common source region 12 can be reduced, minimized or prevented to improve certain of the semiconductor device characteristics.

According to the inventive flash memory device and the method of manufacturing the same, the process of removing the isolation layer to form the common source line can be implemented in a plasma apparatus that forms plasma using a MERIE (magnetic enhanced reactive ion etching) technique, and the by-product generated during removing the isolation layer is substantially uniformly deposited on the surface of the exposed semiconductor substrate. Therefore, an increase in the surface resistance at the common source region can be reduced or prevented, and the characteristics and the reliability of the semiconductor device can be improved.

In addition, the etch profile of the trench can be kept in a substantially vertical shape according to the present invention.

Although a preferred embodiment of the present invention has been described for illustrative purposes, those skilled in the art will appreciate that various modifications, additions and substitutions are possible, without departing from the scope and spirit of the invention as disclosed in the accompanying claims.

The invention claimed is:

1. A method of manufacturing a flash memory device, comprising the steps of:
    forming a gate line on a semiconductor substrate having an isolation layer;
    forming a mask on the semiconductor substrate and the gate line exposing a common source region;
    removing the isolation layer in the common source region using the mask and the gate line as an etch mask and uniformly depositing an isolation layer removal by-product; and
    implanting impurity ions into the exposed common source region.

2. The method of manufacturing a flash memory device as claimed in claim 1, wherein removing the isolation layer comprises a plasma etching process.

3. The method of manufacturing a flash memory device as claimed in claim 2, wherein the plasma etching process comprises generating a plasma through an MERIE (magnetic enhanced reactive ion etching) scheme.

4. The method of manufacturing a flash memory device as claimed in claim 1, wherein the impurity ions are further implanted into a surface of a predetermined trench region.

5. The method of manufacturing a flash memory device as claimed in claim 1, wherein the by-product comprises a fluorocarbon- and/or hydrofluorocarbon-based polymer.

6. The method of manufacturing a flash memory device as claimed in claim 1, wherein the mask exposes a gap between the gate line and a neighboring gate line.

7. The method of manufacturing a flash memory device as claimed in claim 1, wherein removing the isolation layer comprises processing in a plasma apparatus for 30 to 90 seconds.

8. The method of manufacturing a flash memory device as claimed in claim 1, wherein removing the isolation layer comprises plasma etching under conditions including an electric power of about 1,500 W to 2,000 W and a pressure of about 10 mT to 50 mT.

9. The method of manufacturing a flash memory device as claimed in claim 1, wherein removing the isolation layer comprises etching in the presence of a plasma formed from $C_5F_8$ gas, $CH_2F_2$ gas, and an inert gas.

10. The method of manufacturing a flash memory device as claimed in claim 1, wherein removing the isolation layer comprises feeding $C_5F_8$ gas at a rate of about 5 sccm to 20 sccm, $CH_2F_2$ gas at a rate of about 1 sccm, and Ar gas at a rate of about 300 sccm to 500 sccm.

11. The method of manufacturing a flash memory device as claimed in claim 1, wherein the by-product is formed on the exposed surface portion of the semiconductor substrate after removing the isolation layer in the common source region.

12. The method of manufacturing a flash memory device as claimed in claim 1, further comprising controlling an amount of the by-product by controlling an etching process time.

* * * * *